United States Patent
Chen et al.

(10) Patent No.: US 11,985,770 B2
(45) Date of Patent: May 14, 2024

(54) DISPLAY ASSEMBLY AND FOLDABLE DISPLAY DEVICE

(71) Applicant: Hubei Yangtze Industrial Innovation Center of Advanced Display Co., LTD., Wuhan (CN)

(72) Inventors: Kai Chen, Shanghai (CN); Zhiyi Hong, Shanghai (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 88 days.

(21) Appl. No.: 17/740,115

(22) Filed: May 9, 2022

(65) Prior Publication Data
US 2023/0171901 A1    Jun. 1, 2023

(30) Foreign Application Priority Data
Nov. 26, 2021    (CN) .......................... 202111419435.6

(51) Int. Cl.
*H05K 5/02*    (2006.01)
*H05K 5/00*    (2006.01)
(52) U.S. Cl.
CPC ................... *H05K 5/0017* (2013.01)
(58) Field of Classification Search
CPC ........................ H05K 5/0017; H05K 5/0217
USPC ........................................................ 361/807
See application file for complete search history.

(56) References Cited

U.S. PATENT DOCUMENTS

| | | | |
|---|---|---|---|
| 2017/0196078 A1* | 7/2017 | Choi | G06F 1/1641 |
| 2021/0201710 A1* | 7/2021 | Kim | G06F 1/1616 |
| 2022/0159847 A1* | 5/2022 | Ahn | G06F 1/1681 |
| 2023/0135080 A1* | 5/2023 | Wang | G06F 1/1652 |
| | | | 361/749 |

FOREIGN PATENT DOCUMENTS

| | | | | |
|---|---|---|---|---|
| CN | 106652802 A | | 5/2017 | |
| CN | 210836911 U | | 6/2020 | |
| CN | 112365802 | * | 2/2021 | ............... G09F 9/30 |

* cited by examiner

*Primary Examiner* — Hung S. Bui
(74) *Attorney, Agent, or Firm* — Anova Law Group, PLLC

(57) ABSTRACT

A display assembly includes a display panel, a support plate disposed at a non-display surface of the display panel, and an adhesive layer for bonding the display panel and the support plate together. The display panel includes at least a bending area and non-bending areas disposed at two sides of the bending area. The support plate is disposed at the non-bending areas. The adhesive layer includes a first adhesive layer disposed at the non-bending areas and between the display panel and the support plate and a second adhesive layer disposed at the bending area and connected to the first adhesive layer. At least a portion of the bending area is not covered by the adhesive layer.

16 Claims, 7 Drawing Sheets

DISPLAY ASSEMBLY AND FOLDABLE DISPLAY DEVICE

CROSS-REFERENCE TO RELATED APPLICATION

This application claims priority to Chinese Patent Application No. 202111419435.6, filed on Nov. 26, 2021, the entire content of which is incorporated herein by reference.

TECHNICAL FIELD

The present disclosure relates to the technical field of display technology and, more particularly, to a display assembly and a foldable display device.

BACKGROUND

Human sensory organs that receive most information are visual organs. In working and living, people take advantages of more and more abundant visual information. Therefore, display technology plays an important role in todays' society. Since the introduction of the display technology, rapid advancements have been shown. The display technology moves from cathode ray tube (CRT) display, plasma display (PDP), liquid crystal display (LCD), to more recent organic light-emitting diode (OLED) display, and microdiode display.

With the development of human society and insatiable demands for material life improvement, today's display technology is moving towards narrow bezels, high contrast ratio, high resolution, full color display, low power consumption, high reliability, long product life, and thin and light-weight. More specifically, flexible display (or soft screen) makes substantial progress in research and development.

Different from a conventional flat panel display, the flexible display adopts a flexible material as a substrate to achieve flexibility and remarkable visual effect. A flexible display panel can be widely used in various applications, such as a rollable device, a flexible wearable device, a foldable display, etc. Reduction of creases of the flexible display panel has become an urgent technical problem to be solved.

SUMMARY

One aspect of the present disclosure provides a display assembly. The display assembly includes a display panel, a support plate disposed at a non-display surface of the display panel, and an adhesive layer for bonding the display panel and the support plate together. The display panel includes at least a bending area and non-bending areas disposed at two sides of the bending area. The support plate is disposed at the non-bending areas. The adhesive layer includes a first adhesive layer disposed at the non-bending areas and between the display panel and the support plate and a second adhesive layer disposed at the bending area and connected to the first adhesive layer. At least a portion of the bending area is not covered by the adhesive layer.

Another aspect of the present disclosure provides a foldable display device comprising a display assembly. The display assembly includes a display panel, a support plate disposed at a non-display surface of the display panel, and an adhesive layer for bonding the display panel and the support plate together. The display panel includes at least a bending area and non-bending areas disposed at two sides of the bending area. The support plate is disposed at the non-bending areas. The adhesive layer includes a first adhesive layer disposed at the non-bending areas and between the display panel and the support plate and a second adhesive layer disposed at the bending area and connected to the first adhesive layer. At least a portion of the bending area is not covered by the adhesive layer.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Figure 1:
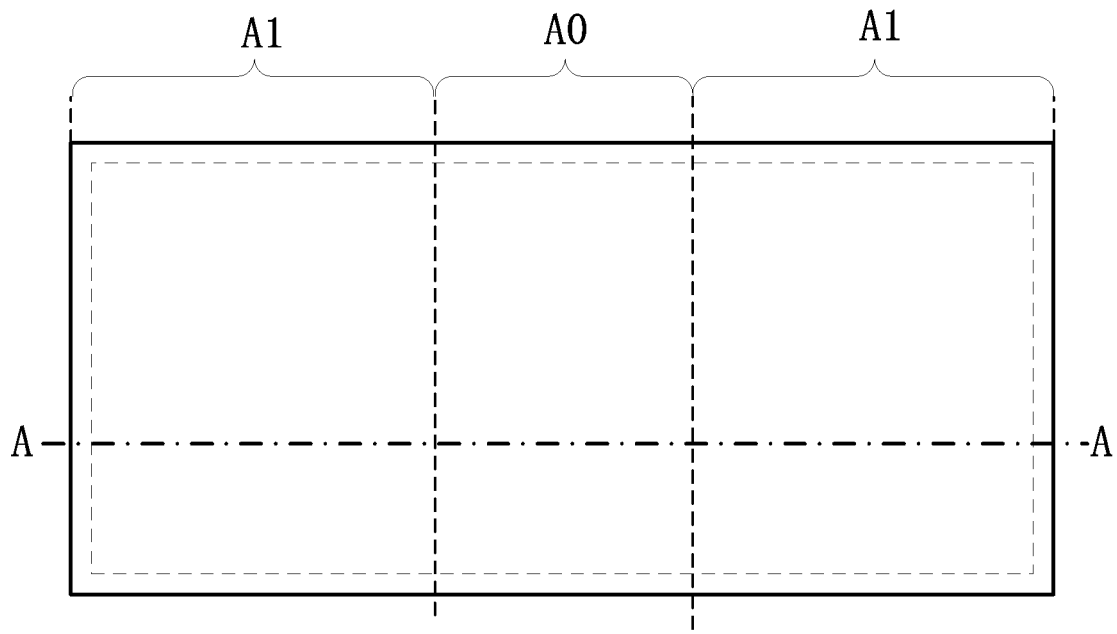
FIG. 1 illustrates a schematic diagram of a top view of an exemplary display assembly according to some embodiments of the present disclosure.

Various features and embodiments of the present disclosure are described in detail below with reference to the accompanying drawings. In the description below, numerous specific details are proposed to provide a comprehensive understanding of the present disclosure. However, for those skilled in the art, the present disclosure may be implemented without some of the specific details. The description of the embodiments below is intended to provide a better understanding of the present disclosure through examples. In the drawings and the specification below, certain well-known structures and technical details are not shown to avoid unnecessary ambiguity. For clarity, dimensions of certain structures may be expanded to show structural details. In addition, the features, structures, or characteristics described below may be combined in one or more embodiments in any suitable manner.

In the description of the present disclosure, it should be noted that, unless otherwise specified, "plurality" means two or more. The orientation or position relationship indicated by terms "upper," "lower," "left," "right," "inner," and "outer" are only for the convenience and simplification of describing the present disclosure, do not indicate or imply that a device or an element referred herein must have a specific orientation or must be constructed and operated in a specific orientation, and hence cannot be construed as limiting the present disclosure. In addition, terms "first" and "second" are only used for illustration purpose, and cannot be construed as indicating or implying relative importance.

Words appeared in the description below for describing directions refer to directions in the drawings, and do not limit a specific structure of the embodiments of the present disclosure. In the description of the present disclosure, it should be noted that, unless otherwise clearly specified and limited, terms "installation" and "connection" should be interpreted in a broad sense. For example, the terms may refer to a fixed connection, a detachable connection, or an integral connection. The connection may be direct or indirect. For those of ordinary skill in the art, the specific meaning of the above-mentioned terms in the specification can be interpreted according to specific circumstances.

The technologies, methods, and equipment known to those of ordinary skill in the art may not be discussed in detail, but where appropriate, the technologies, methods, and equipment should be regarded as part of the specification.

In all the examples shown and discussed herein, any specific value should be interpreted as merely exemplary, rather than as a limitation. Therefore, other examples of the exemplary embodiment may have different values.

It should be noted that similar reference numerals and letters indicate similar items in the drawings, so once an item is defined in one drawing, it does not need to be further discussed in the subsequent drawings.

During a folding process of a foldable display device, a display panel is prone to creases at a folded position due to a relatively large squeezing force. When the display panel is unfolded for display, obvious creases appearing at the folded position affect an overall display effect to a large extent, and at the same time affect user's experience.

To this end, the present disclosure provides a display assembly and a foldable display device, aiming to mitigate the problem of creases, so as to improve a display effect of display products and user's experience thereof.

Figure 2:
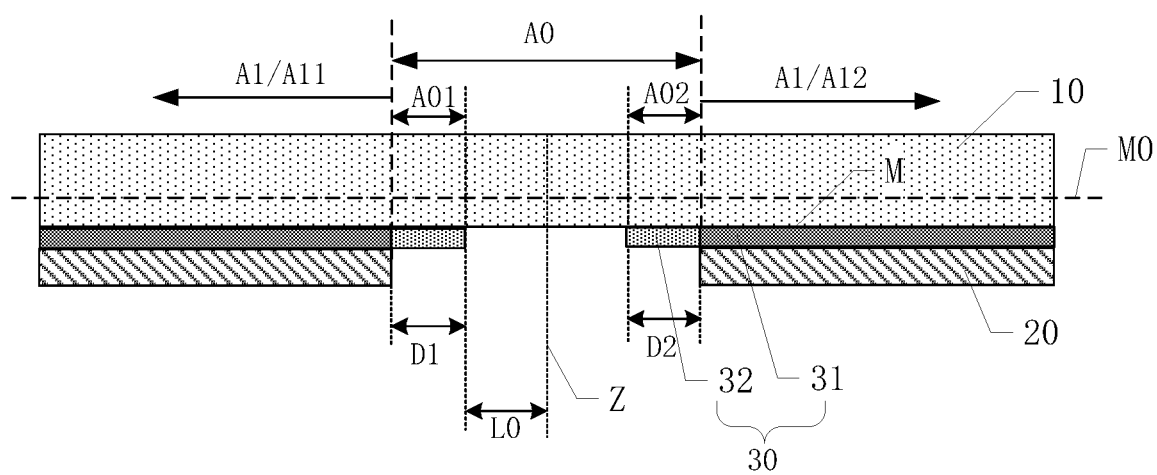
FIG. 2 illustrates a schematic diagram of an AA cross-sectional view of the exemplary display assembly shown in FIG. 1.

FIG. 1 illustrates a schematic diagram of a top view of an exemplary display assembly according to some embodiments of the present disclosure. FIG. 2 illustrates a schematic diagram of an AA cross-sectional view of the exemplary display assembly shown in FIG. 1. As shown in FIG. 1 and FIG. 2, the present disclosure provides a display assembly. The display assembly includes a display panel 10, a support plate 20, and an adhesive layer 30. The display panel 10 is a flexible display panel. The support plate 20 is disposed at a non-display surface M of the display panel 10. The support plate 20 and the display panel 10 are fixed together through the adhesive layer 30. The display panel 10 includes at least one bending area A0 and a non-bending area A1 located at both sides of the at least one bending area A0. One bending area A0 is used in the description below. The support plate 20 is disposed at the non-bending area A1. The adhesive layer 30 includes a first adhesive layer 31 and a second adhesive layer 32. The first adhesive layer 31 is disposed at the bending area A0 and between the support plate 20 and the display panel 10. The second adhesive layer 32 is disposed at the bending area A0 and is connected to the first adhesive layer 31. At least a portion of the bending area A0 includes no adhesive layer 30.

In some embodiments, as shown in FIG. 1, for illustration purpose, the display assembly has a rectangular shape, which should not be construed as a limitation to the present disclosure. In some other embodiments, the display assembly may also have a circle shape, or an oval shape, etc. In addition, as shown in FIG. 2, the display panel 10, the adhesive layer 30, and the support plate 20 show a relative position for illustration in the display assembly, and do not represent actual dimensions of various film layers. Actual film layer structure of the display panel 10 is not shown in FIG. 2. In practical applications, the display panel 10 is a multiple-layer structure, which will be described in detail in the embodiments of the present disclosure. Further, as shown in FIG. 1 and FIG. 2, for illustration purpose, the display assembly 100 includes one bending area A0 and two non-bending areas A1 disposed on both sides of the bending area A0. In some other embodiments, the display assembly 100 may further include two or more bending areas A0, which is not limited by the present disclosure.

In some embodiments, as shown in FIG. 1 and FIG. 2, the display assembly 100 provided by the embodiments of the present disclosure includes the display panel 10, the support plate 20, and the adhesive layer 30. The support plate 20 is disposed at a surface of the display panel 10 facing away from a light-emitting surface of the display panel 10, that is, the non-display surface M of the display panel 10. The non-display surface M is a surface disposed opposite to the light-emitting surface. The support plate 20 and display panel 10 are fixed together through the adhesive layer 30. The display panel 10 includes the bending area A0 and the non-bending areas A1 disposed at both sides of the bending area A0. The support plate 20 is disposed at the non-bending areas A1. In some embodiments, the support plate 20 has an elastic modulus greater than that of the adhesive layer 30. The support plate 20 is used to support the display panel 10 in the non-bending area A1 to avoid deformation in the non-bending areas A1 of the display panel 10. Moreover, the support plate 20 is attached to the non-display surface M of the display panel 10 by the adhesive layer 30 to ensure bending performance of the display assembly and at the same time enhance an overall stiffness of the display assembly 100. The enhanced stiffness may substantially reduce the creases on the display assembly 100 caused by folding.

In some embodiments, the adhesive layer 30 of the display assembly 100 includes the first adhesive layer 31 disposed at the non-bending areas A1 and the second adhesive layer 32 disposed at the bending area A0. The first adhesive layer 31 disposed at the non-bending areas A1 is used to bond and fix the support plate 20 and the display panel 10 together. The second adhesive layer 32 disposed at the bending area A0 is connected to the first adhesive layer 31 disposed at the non-bending areas A1. At least a portion of the bending area A0 includes no adhesive layer 30. That is, the second adhesive layer 32 does not completely cover the bending area A0. Thus, defective products as a result of excessively squeezing a display area of the bending area A0 may avoided to a certain extent.

Figure 3:
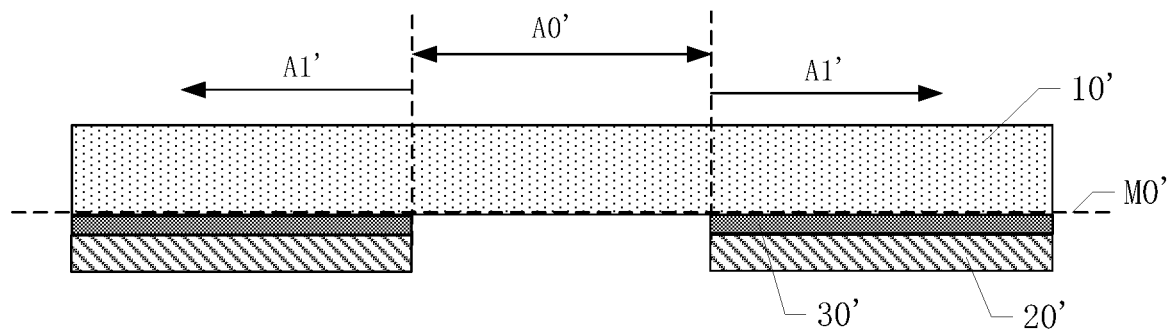
FIG. 3 illustrates a schematic diagram of an exemplary foldable display device according to some embodiments of the present disclosure.

FIG. 3 illustrates a schematic diagram of an exemplary foldable display device according to some embodiments of the present disclosure. As shown in FIG. 3, the foldable display device includes a display panel 10', an adhesive layer 30', and a support plate 20'. The adhesive layer 30' and the support plate 20' are disposed at non-bending areas A1' on both sides of a bending area A0'. The bending area A0' includes no adhesive layer 30'. When the adhesive layer 30' is only disposed at the non-bending areas A1', a neutral surface M0' of the display panel 10' is located at a surface of the display panel 10' facing toward the support plate 20'. When the foldable display device is in a folded state, the neutral surface M0' includes multiple film layers (in a direction toward the light-emitting surface of the display panel 10'). An inner side of the display panel 10' in the bending area A0' is squeezed and an outer side of the display panel 10' is stretched. The film layers that are squeezed in the inner side of the display panel 10' are distant from the neutral surface M0', and are subject to a more substantial squeezing force, thereby resulting in obvious creases. Thus, to a large extent, the obvious creases affect display effect of the display panel 10' in an unfolded state (or an unfolded state), and also degrade the user's experience.

In some embodiments, the neutral surface of the display panel refers to a virtual plane of the display panel that is neither under tension nor under press.

Figure 4:
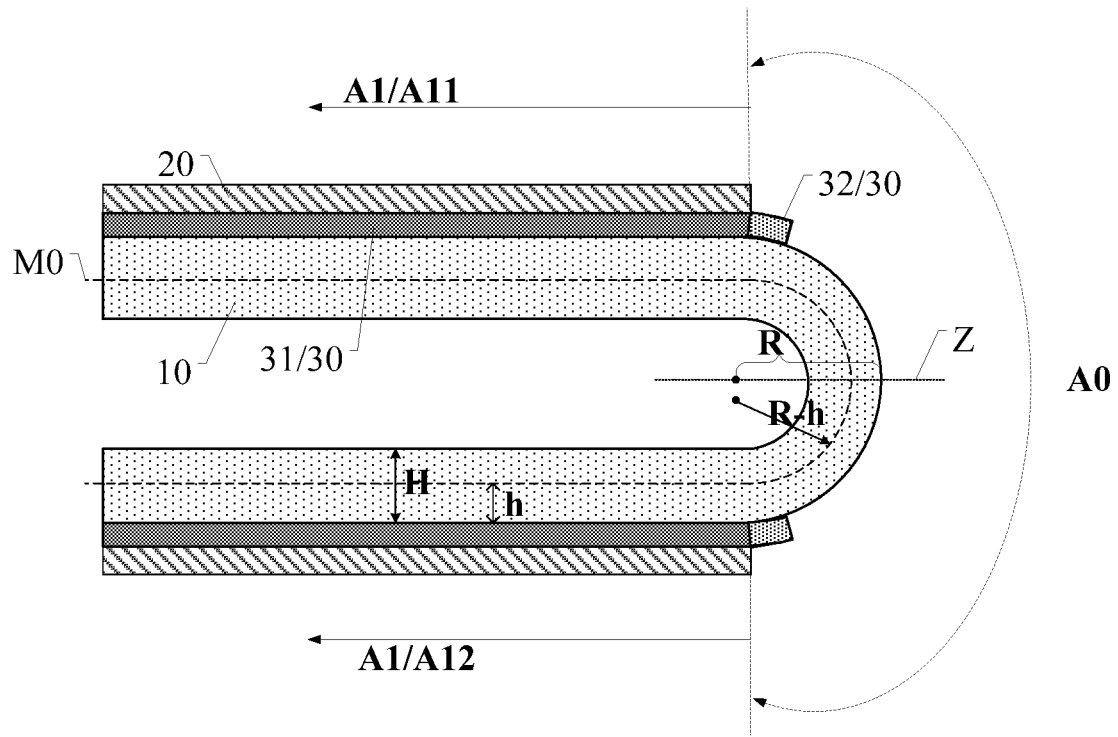
FIG. 4 illustrates a schematic diagram of an exemplary display assembly in a folded state according to some embodiments of the present disclosure.

In some embodiments, as shown in FIG. 2, the second adhesive layer 32 is disposed at portions of the bending area A0 adjacent to the non-bending area A1. FIG. 4 illustrates a schematic diagram of an exemplary display assembly in a folded state according to some embodiments of the present disclosure. As shown in FIG. 4, when the display assembly is in the folded state, the second adhesive layer 32 disposed at the bending area A0 applies a pulling force on the display panel 10, thereby forcing the neutral surface M0 of the display panel 10 to move upward, that is, in a direction along the support plate 20 pointing toward the display panel 10. The neutral surface M0 moves toward a direction of the light-emitting surface of the display panel 10. In some embodiments, when the display assembly is in the folded state, compared with a scheme in which the neutral surface is disposed at a surface of the display panel 10 facing toward the support plate 20, the number of film layers disposed above the neutral surface (in a direction toward the light-emitting surface of the display panel) is reduced. The number of film layers that are squeezed in the display panel 10 in the folded state is reduced, and an extent of being squeezed is minimized accordingly. Thus, the obvious creases in the bending area A0 are effectively reduced, the display effect of the display product in the unfolded state is improved, and the user's experience is improved.

In some embodiments, the adhesive layer 30 may be made of adhesive materials such as a pressure sensitive adhesive material, a double-side adhesive tape, or a water-based adhesive material (e.g., an optical clear resin). When the adhesive layer 30 is made of a water-based material, the water-based adhesive material may be formed on the support plate 20 by costing, and the coated support plate 20 is then bonded with the display panel 10. In some other embodiments, the water-based adhesive material may be formed on the display panel 10 by costing, and the costed display panel 10 is then bonded with the support plate 20. The present disclosure does not limit how the support plate 20 and the display panel 10 are bonded by the adhesive layer 30.

In some embodiments, the support plate 20 is made of an alloy. For example, the support plate 20 is made of a copper-nickel alloy, a titanium alloy, or stainless steel. Under the premise that the display panel 10 can be bent, the support plate 20 provides support to the flexible display panel 10. The alloy material is rigid. When the display assembly is in the unfolded state, the support plate 20 provides the support to the flexible display panel 10 and presents the non-bending areas A1 of the flexible display panel 10 from deformation and creases due to being bent.

Figure 5:
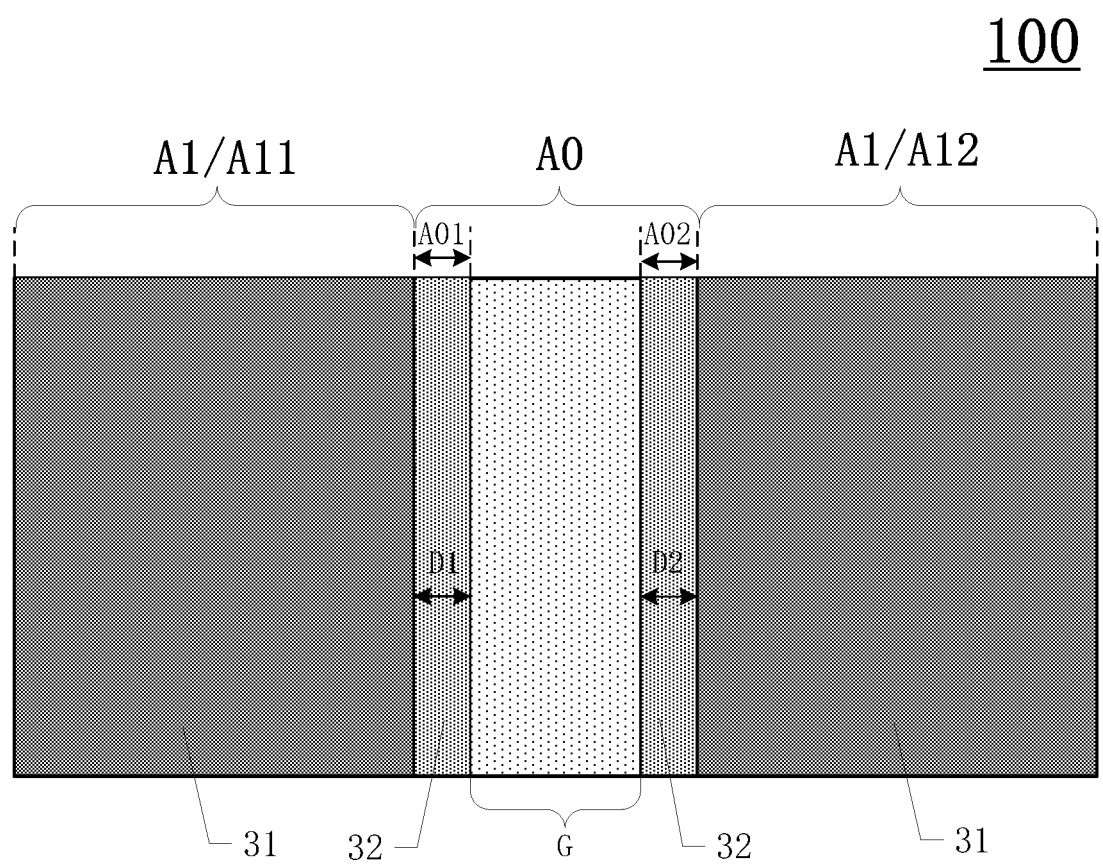
FIG. 5 illustrates a schematic diagram of an arrangement of a first adhesive layer and a second adhesive layer on an exemplary display panel according to some embodiments of the present disclosure.

FIG. 5 illustrates a schematic diagram of an arrangement of a first adhesive layer 31 and a second adhesive layer 32 on an exemplary display panel 10 according to some embodiments of the present disclosure. In some embodiments, as shown in FIG. 5, the non-bending areas A1 adjacent to a same bending area A0 include a first non-bending sub-area A11 and a second non-bending sub-area A12, respectively. The bending area A0 includes a first bending sub-area A01 and a second bending sub-area A02. The first bending sub-area A01 is adjacent to the first non-bending sub-area A11. The second bending sub-area A02 is adjacent to the second bending sub-area A12. Between the first bending sub-area A01 and the second bending sub-area A02 is a first gap G. The second adhesive layer 32 is disposed at the first bending sub-area A01 and the second bending sub-area A02.

In some embodiments, the display assembly includes the first non-bending sub-area A11 and the second non-bending area A12 disposed at both sides of a same bending area A0). The bending area A0 includes the first bending sub-area A01 adjacent to the first non-bending sub-area A11 and the second bending sub-area A02 adjacent to the second non-bending sub-area A12. The first bending sub-area A01 and the second bending sub-area A02 are not connected, and are separated by the first gap G. The second adhesive layer 32 is disposed at the first bending sub-area A01 and the second bending sub-area A02. No adhesive layer 30 is disposed in the first gap G. If the second adhesive layer 32 is only disposed at the first bending sub-area A01 or the second bending sub-area A02, when the display assembly is bent or in the folded state, the first bending sub-area A01 and the second bending subarea A02 of the display panel 10 are subject to different forces, thereby making it difficult for the neutral surface of the display panel 10 to reliably move upward. Therefore, the second adhesive layer 32 is disposed in both the first bending sub-area A01 and the second bending sub-area A02 of the bending area A0, both of which are adjacent to the non-bending areas A1. When the display assembly is bent or in the folded state, the second adhesive layer 32 disposed at the first bending sub-area A01 and the second bending sub-area A02 applies a pulling force on the display panel 10, such that the display panel 10 is subject to substantially similar forces in both the first bending sub-area A01 and the second bending sub-area A02. As such, the neutral surface of the display panel 10 stably moves upward under the pulling force of the second adhesive layer 32. The number of film layers disposed above the neutral surface is reduced. When the display panel 10 is in the folded state, the number of film layers that are squeezed is reduced, and the extent of being squeezed is minimized accordingly. Thus, the obvious creases in the bending area A0 are effectively reduced. Further, when the second adhesive layer 32 is disposed simultaneously at the first bending sub-area A01 and the second bending sub-area A02, the second adhesive layer 32 applies substantially similar forces on the display panel 10 in both the first bending sub-area A01 and the second bending sub-area A02. Thus, bending reliability of the display assembly is improved.

In some embodiments, when the second adhesive layer 32 is disposed at the first bending sub-area A01 and the second bending sub-area A02, respectively, the second adhesive layer 32 completely covers the first bending sub-area A01 and the second bending sub-area A02.

In some embodiments, as shown in FIG. 2 and FIG. 5, in a direction along the non-bending area A1 pointing toward the bending area A0, a width D1 of the second adhesive layer 32 disposed at the first bending sub-area A01 is equal to a width D2 of the second adhesive layer 32 disposed at the second bending sub-area A02.

In some embodiments, in the display assembly, the width D1 of the second adhesive layer 32 disposed at the first bending sub-area A01 is configured to be equal to the width D2 of the second adhesive layer 32 disposed at the second bending sub-area A02, such that an area covered by the second adhesive layer 32 in the first bending sub-area A01 of the display panel 10 is equal to an area covered by the second adhesive layer 32 in the second bending sub-area A02 of the display panel 10. As such, when the display panel 10 is in the folded state, the second adhesive layer 32 applies substantially similar forces on the display panel 10 in both the first bending sub-area A01 and the second bending sub-area A02. Thus, the neutral surface of the display panel 10 can move upward smoothly to reduce the obvious creases caused by bending the display panel 10.

In some embodiments as shown in FIG. 2, a thickness of the second adhesive layer 32 disposed at the first bending sub-area A01 is equal to a thickness of the second adhesive layer 32 disposed at the second bending sub-area A02.

In some embodiments, the thickness of the second adhesive layer 32 refers to a thickness of the second adhesive layer 32 in a direction along the second adhesive layer 32 pointing toward the display panel 10. Because the second adhesive layer 32 is attached to the non-display surface M of the display panel 10 and is disposed at the bending area A0, when the display panel 10 is bent or in the folded state, the second adhesive 32 applies a force on the display panel 10. When the second adhesive layer 32 has a same width and a different thickness, the second adhesive layer 32 applies different forces on the display panel 10. In the embodiments of the present disclosure, the thickness of the second adhesive layer 32 disposed at the first bending sub-area A01 is equal to the thickness of the second adhesive layer 32 disposed at the second bending sub-area A02, such that the forces applied on the display panel 10 in both the first bending sub-area A01 and the second bending sub-area A02 are substantially similar. In addition, when the width of the second adhesive layer 32 disposed at the first bending sub-area A01 is configured to be equal to the width of the second adhesive layer 32 disposed at the second bending sub-area A02, when the display panel 10 is bent or in the folded state, a force applied by the second adhesive layer 32 on the display panel 10 in the first bending sub-area A01 is equal to a force applied by the second adhesive layer 32 on the display panel 10 in the second bending sub-area A02, thereby ensuring that the neutral surface of the display panel 10 moves upward smoothly. The number of film layers that are squeezed in the display panel 10 in the folded state is reduced. When the number of film layers that are squeezed is reduced, the extent of being squeezed is minimized accordingly. Thus, the obvious creases in the bending area A0 are effectively reduced, the display effect of the display product in the unfolded state is improved, and the user's experience is improved.

In some embodiments, as shown in FIG. 2, FIG. 4, and FIG. 5, the display assembly includes the unfolded state and the folded state. In the folded state, the bending area A0 has a semicircular shape.

FIG. 2 and FIG. 5 illustrate a structure of the display assembly in the unfolded state. As shown in FIG. 2 and FIG. 5, the bending area A0 and the non-bending area A1 of the display panel 10 are located on a same plane. When the display panel 10 is unfolded, a large size image can be displayed, thereby improving the user's visual experience. FIG. 4 illustrates a structure of the display assembly in the folded state. In the folded state, the bending area A0 has a semicircular shape. A portion of the display panel 10 in the first non-bending sub-area A11 is parallel with a portion of the display panel 10 in the second non-bending sub-area A12. The entire display panel 10 forms a U-shape. After the display assembly is folded, the display assembly occupies less space, making it more portable.

In some embodiments, as shown in FIG. 2 and FIG. 4, the display panel 10 includes a central axis Z located in the bending area A0. A distance between an end surface of the second adhesive layer 32 facing toward the central axis Z and the central axis Z of the display panel 10 is L0, where $L0=(R-h)\cdot\pi\cdot 0.5$, $0<h<R$, R is a radius of the semicircle shape formed in a folding area when the display panel 10 is in the folded state, and h is a distance between the neutral surface of the display panel 10 and a surface of the support plate 20 facing toward the display panel 10.

If no second adhesive layer 32 is disposed at the first bending sub-area A01 and the second bending sub-area A02, according to the circumference formula of the circle, a distance between the end surface of the second adhesive layer 32 facing toward the central axis Z and the central axis Z of the display panel 10 is $L1=R\cdot\pi\cdot 0.5$. In this case, the neutral surface M0 of the display panel 10 is located at a surface of the display panel 10 facing toward the support plate 20. In some embodiments, after the second adhesive layer 32 is disposed at the first bending sub-area A01 and the second bending sub-area A02, the neutral surface of the display panel 10 moves up toward a light-emitting direction of the display panel 10 by a distance h with respect to the surface of the display panel 10 facing toward the support plate 20. At this point, the distance between the end surface of the second adhesive layer 32 facing toward the central axis Z and the central axis Z of the display panel 10 is $L0=(R-h)\cdot\pi\cdot 0.5$. That is, the distance between the end surface of the second adhesive layer 32 facing toward the central axis Z and the central axis Z of the display panel 10 is reduced because the neutral surface M0 of the display panel 10 moves upward. The distance L0 can be used to calculate the thickness of the second adhesive layer 32 disposed at the first bending sub-area A01 and the second bending sub-area A02. That is, subtracting the distance L0 from the distance between the end surface of the second adhesive layer 32 facing toward the central axis Z and the central axis Z of the display panel 10 is the thickness of the second adhesive layer 32 disposed at the first bending sub-area A01 or the second bending sub-area A02. By configuring the second adhesive layer 32 with a corresponding width, the neutral surface M0 of the display panel 10 can be moved upward in a process of bending or folding to reduce the number of film layers that are squeezed in the display panel 10. When the number of film layers that are squeezed is reduced, the extent of being squeezed is minimized accordingly, and the creases are effectively reduced. Thus, Thus, the obvious creases in the bending area A0 are effectively reduced, the display effect of the display product in the unfolded state is improved, and the user's experience is improved.

In some embodiments, as shown in FIG. 4, the thickness of the display panel 10 is H, and $h<H$.

In some embodiments, the thickness of the display panel 10 refers to a thickness in a direction perpendicular to the light-emitting surface of the display panel 10. After the second adhesive layer 32 is disposed at the first bending sub-area A01 and the second bending sub-area A02, when the display panel 10 is bent or in the folded state, the neutral surface of the display panel 10 moves upward. When the distance h between the neutral surface of the display panel 10 and the surface of the display panel 10 facing toward the support plate 20 is smaller than the thickness of the display panel 10, the neutral surface M0 of the display panel 10 is ensured to be located inside the display panel 10. On one hand, the extend of the display panel 10 being squeezed when the display panel 10 is bent or in the folded state is reduced. On the other hand, excessive stretching of the display panel 10 when the display panel 10 is bent or in the folded state can be avoided.

In some embodiments, as shown in FIG. 2, the first adhesive layer 21 and the second adhesive layer 32 have a same thickness.

In some embodiments, when the thickness of the first adhesive layer 31 disposed at the non-bending areas A1 is the same as the thickness of the second adhesive layer 32 disposed at the bending area A0, the first adhesive layer 31 and the second adhesive layer 32 can be fabricated with a same thickness specification to simplify a fabrication process of forming the adhesive layer 30 between the display panel 10 and the support plate 20. In addition, when the first adhesive layer 31 and the second adhesive layer 32 have a same thickness, surfaces of the first adhesive layer 31 and the second adhesive layer 32 facing away from the display panel 10 are coplanar with each other. When the first adhesive layer 31 and the second adhesive layer 32 are formed on the display panel 10 and then the support plate 20 is attached, the coplanar surfaces facilitate a smooth attaching process.

Figure 6:
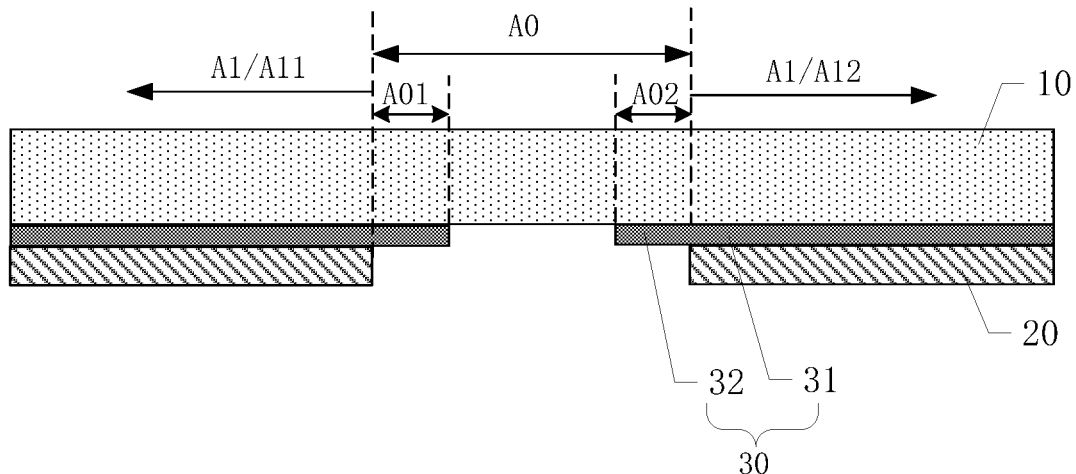
FIG. 6 illustrates a schematic diagram of another AA cross-sectional view of the exemplary display assembly shown in FIG. 1.

FIG. 6 illustrates a schematic diagram of another AA cross-sectional view of the exemplary display assembly shown in FIG. 1. In some embodiments, as shown in FIG. 6, the first adhesive layer 31 and the second adhesive layer 32 are formed into a single piece. In the drawings of the embodiments of the present disclosure, the first adhesive layer 31 and the second adhesive layer 32 are filled with a same shading and/or pattern to indicate that the first adhesive layer 31 and the second adhesive layer 32 are formed into the single piece.

In some embodiments, when the first adhesive layer 31 disposed at the non-bending areas A1 and the second adhesive layer 32 disposed at the bending area A0 are formed into the single piece, the second adhesive layer 32 disposed at the non-bending areas A1 is equivalent to an extension of the first adhesive layer 31 disposed at the non-bending areas A1. In some embodiments, the second adhesive layer 32 disposed at the first bending sub-area A01 is equivalent to being obtained by extending the first adhesive layer 31 disposed at the first non-bending sub-area A11, and the second adhesive layer 32 disposed at the second bending sub-area A02 is equivalent to being obtained by extending the first adhesive layer 31 disposed at the second non-bending sub-area A12. As such, the first adhesive layer 31 and the second adhesive layer 32 are formed at the same time in the display assembly. No separate fabrication process is needed for forming the second adhesive layer 32. Thus, the fabrication process of the display assembly is simplified, and the production efficiency of the display assembly is improved. In addition, in the process of bending or folding the display assembly, the second adhesive layer 32 applies a pulling force on the display panel 10, and at the same time, the display panel 10 applies another pulling force on the second adhesive layer 32. When the second adhesive layer 32 and the first adhesive layer 31 are formed into the single piece, the first adhesive layer 31 and the second adhesive layer 32 that are formed into the single piece yield a large adhesive force, thereby preventing the second adhesive layer 32 from being separated from the first adhesive layer 31 under the above-described pulling force. After the second adhesive layer 32 is separated from the first adhesive layer 31, the pulling force applied by the second adhesive layer 32 on the display panel 10 is reduced substantially, making it difficult for the neutral surface M0 of the display panel 10 to reliably move upward. In the embodiments of the present disclosure, the first adhesive layer 31 and the second adhesive layer 32 are formed into the single piece to ensure that the neutral surface M0 of the display panel 10 moves upward reliably. Thus, the extent of being squeezed is minimized when the display assembly is bent or in the folded state, and the obvious creases caused by the squeeze can be reduced accordingly.

Figure 7:
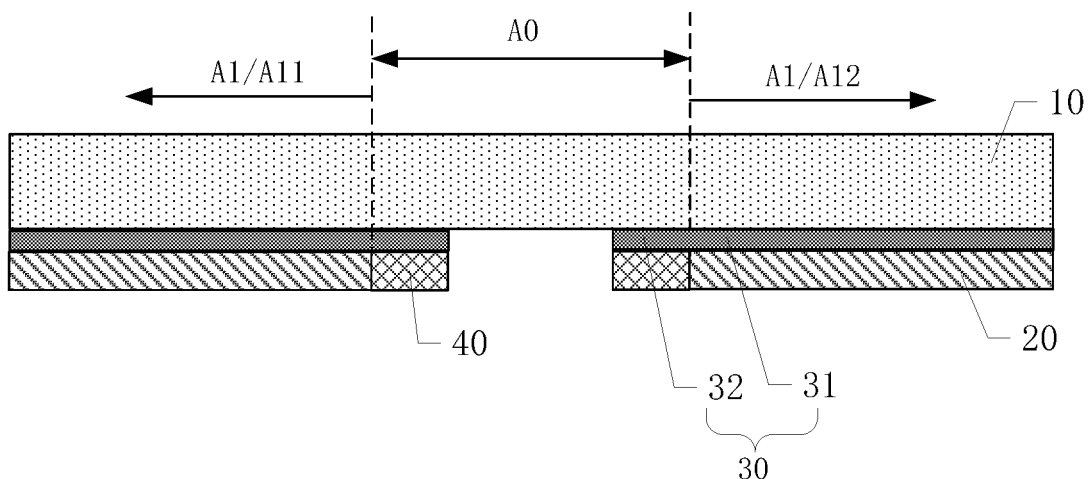
FIG. 7 illustrates a schematic diagram of another AA cross-sectional view of the exemplary display assembly shown in FIG. 1.

FIG. 7 illustrates a schematic diagram of another AA cross-sectional view of the exemplary display assembly shown in FIG. 1. In some embodiment, as shown in FIG. 7, a cover film 40 is disposed in the bending area A0 at a surface of the second adhesive layer 32 facing away from the display panel 10.

In some embodiments, when the second adhesive layer 32 is disposed at the bending area A0 to reduce the creases caused by bending or folding the display panel 10, if the second adhesive layer 32 is exposed, external debris may adhere to the second adhesive layer 32 to affect normal function of the second adhesive layer 32 because an exposed surface of the second adhesive layer 32 is adhesive. As shown in FIG. 7, after the cover film 40 is disposed at the surface of the second adhesive layer 32 facing away from the display panel 10, the cover film 40 protects the second adhesive layer 32, prevents the external debris from adhering to the second adhesive layer 32, and ensures that the second adhesive layer 32 smoothly moves the neutral surface M0 of the display panel 10 upward when the display assembly is bent or in the folded state. Thus, the extent of being squeezed is reduced when the display panel 10 is bent or in the folded state, and the creases caused by bending or folding the display panel 10 are reduced accordingly.

In some embodiments, the cover film 40 may be, for example, a suitable film structure that is attached to the second adhesive layer 32, includes a non-adhesive surface of the cover film 40 facing away from the display panel 10, and protects the second adhesive layer 32.

Figure 8:
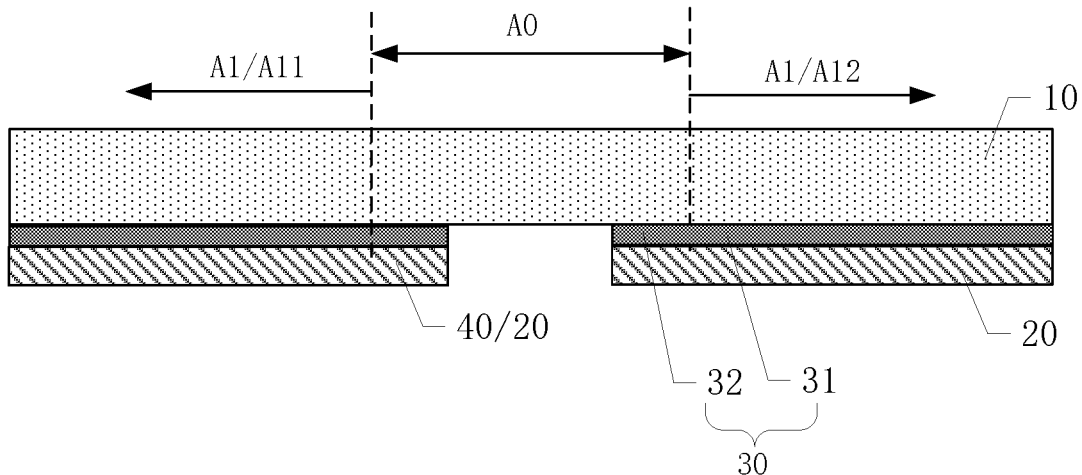
FIG. 8 illustrates a schematic diagram of another AA cross-sectional view of the exemplary display assembly shown in FIG. 1.

In some embodiments, as shown in FIG. 7, the cover film 40 is disposed at the surface of the second adhesive layer 32 facing away from the display panel 10 to prevent the second adhesive layer 32 from being exposed. In some other embodiments, another film layer in the display assembly may be multiplexed as the cover film 40. FIG. 8 illustrates a schematic diagram of another AA cross-sectional view of the exemplary display assembly shown in FIG. 1. In some embodiments, the support plate 20 extends into the bending area A0. The support plate 20 is multiplexed as the cover film 40. In the drawings of the embodiments of the present disclosure, the cover film 40 and the support plate 20 are filled with a same shade and/or pattern to indicate that the support plate 20 is multiplexed as the cover film 40.

In some embodiments, FIG. 8 illustrates extending the support plate 20 from the non-bending area A1 to the bending area A0. The support plate 20 extended into the bending area A0 is multiplexed as the cover film 40. When the support plate 20 is multiplexed as the cover film 40, a portion of the support plate 20 pointing from the non-bending area A1 to the bending area A0 is increased in size.

Compared with forming the cover film 40 separately, the present disclosure does not need a new film layer and a new process thereof, thereby simplifying the fabrication process of the film layer structure of the display assembly.

In addition, because the support plate 20 has an elastic modulus larger than that of the second adhesive layer 32, when the support plate 20 is multiplexed as the cover film 40, the support plate 20 can join the second adhesive layer 32 to apply the pulling force on the display panel 10 when the display assembly is bent or in the folded state. Compared with only applying the pulling force by the second adhesive layer 32 on the display panel 10, the combined pulling force jointly applied by the support plate 20 and the second adhesive layer 32 helps the neutral surface M0 of the display panel 10 to stably move upward. Thus, the squeezing force received by the display panel 10 is reduced, the creases caused by bending the display panel 10 are reduced, and an overall display effect of the display assembly and the user's experience are improved.

Figure 9:
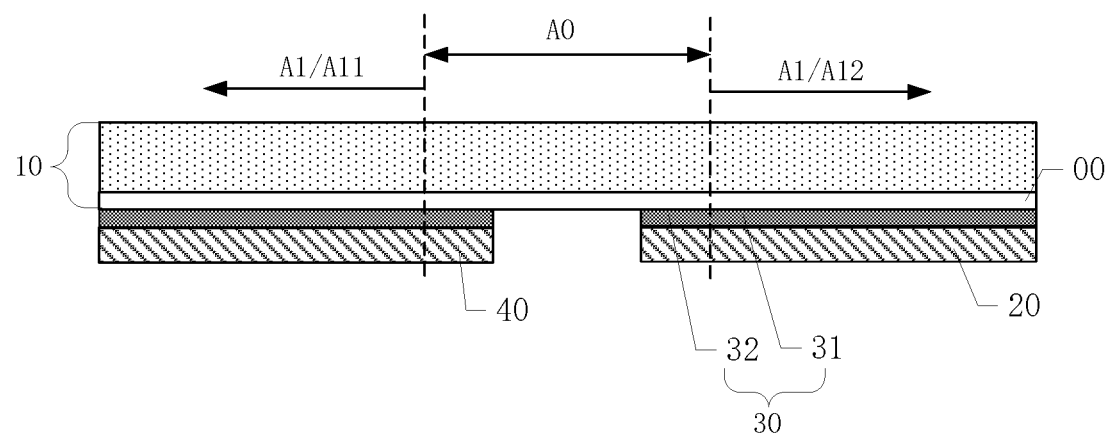
FIG. 9 illustrates a schematic diagram of another AA cross-sectional view of the exemplary display assembly shown in FIG. 1.

FIG. 9 illustrates a schematic diagram of another AA cross-sectional view of the exemplary display assembly shown in FIG. 1. In some embodiments, as shown in FIG. 9, the display panel 10 includes a substrate 00. The substrate 00 is made of polyimide or stainless steel.

In the process of bending or folding the display assembly, the display panel 10 is bent or folded accordingly. In some embodiments, the display panel 10 is a flexible display panel 10. The substrate 00 of the display panel 10 is a flexible substrate 00. When the substrate 00 is made of polyimide or stainless steel, the substrate 00 has a desired tensile property and elongation rate, thereby adapting to repeated unfolding and folding of the display assembly and preventing the display assembly from breakage or difficult to bend.

Figure 10:
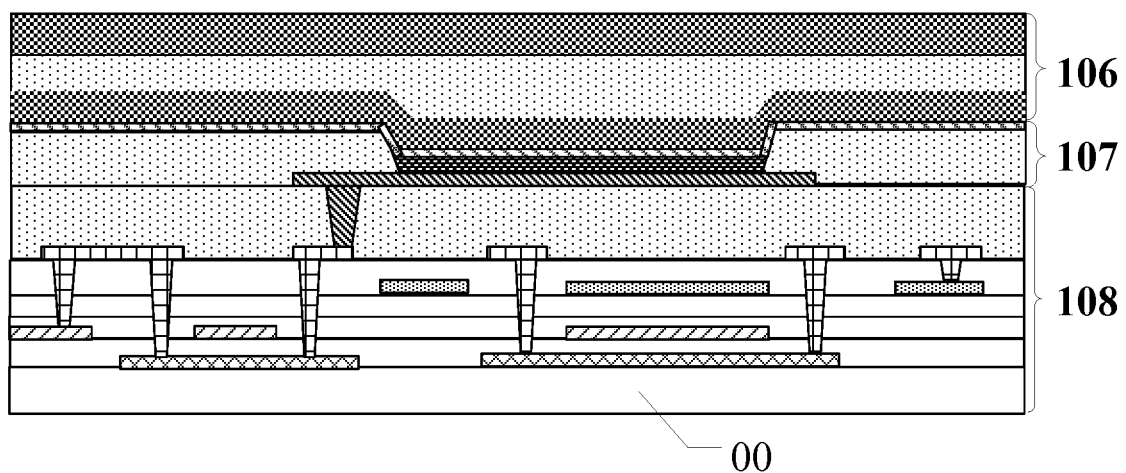
FIG. 10 illustrates a schematic diagram of an exemplary display panel according to some embodiments of the present disclosure.

In some embodiments, the display panel 10 of the display assembly may include an organic electroluminescence display panel, an electronic paper, or an inorganic light-emitting diode display panel. FIG. 10 illustrates a schematic diagram of an exemplary display panel according to some embodiments of the present disclosure. For illustration purpose, the display panel is an organic electroluminescence display panel. In some embodiments, as shown in FIG. 10, the display panel 10 includes a substrate 00, a driving circuit layer 108, a light-emitting element layer 107, and an encapsulation layer 106, that are stacked together. The driving circuit layer 108 and the light-emitting element layer 107 are disposed between the substrate 00 and the encapsulation layer 106.

In some embodiments, FIG. 10 illustrates a structure of the flexible display panel 10. The driving circuit layer 108 is configured with a plurality of transistors for driving the light-emitting element layer 107 to emit light. The light-emitting element layer 107 may be, for example, made of an organic light-emitting material. The light-emitting element layer 107 may include mini-LEDs or micro-LEDs. For illustration purpose, the light-emitting element layer 107 shown in FIG. 10 only includes organic light-emitting elements, which are not intended to be limiting. The encapsulation layer 106 is used to encapsulate the light-emitting element layer 107 to prevent external moisture or oxygen from affecting the light-emitting element layer 107.

In the embodiments of the present disclosure, the display panel may be an organic electroluminescence display panel, an electronic paper, or an inorganic light-emitting diode display panel, all of which have a certain degree of flexibility, and satisfies folding requirements of a foldable display device.

Figure 11:
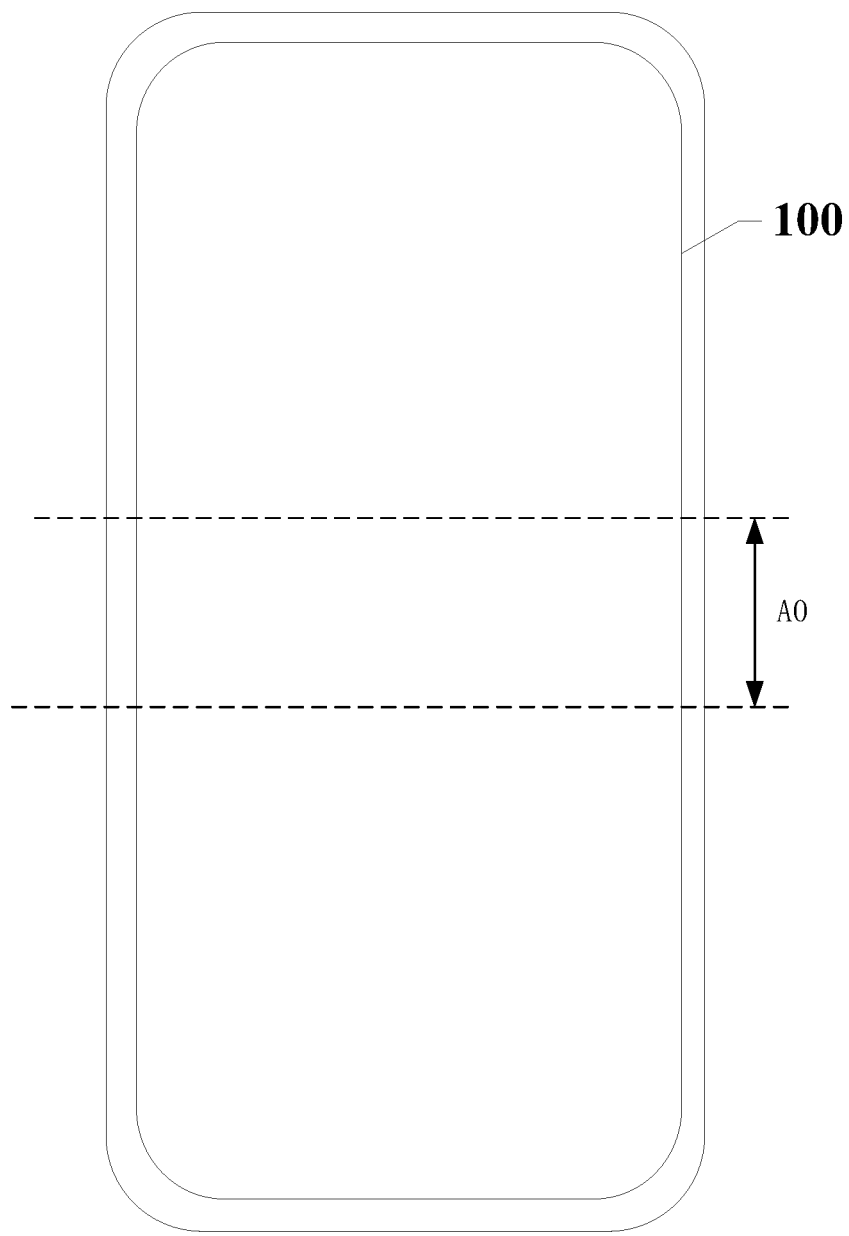
FIG. 11 illustrates a schematic diagram of an exemplary foldable display device in an unfolded state according to some embodiments of the present disclosure.

The present disclosure also provides a foldable display device. FIG. 11 illustrates a schematic diagram of an exemplary foldable display device in an unfolded state according to some embodiments of the present disclosure. The foldable display device includes a display assembly provided by the embodiments of the present disclosure. The foldable display device can be folded in half through the bending area A0, thereby reducing a space occupied by the foldable display device and making it more portable. In some embodiments, in the unfolded state, the foldable device may have a horizontal display screen or vertical display screen, which is not limited by the present disclosure. When being folded, multiple bending areas may be configured to facilitate multiple folding, such that the space occupied by the foldable display device can be further reduce, thereby making the foldable display device more portable.

In some embodiments, because the bending area includes the second adhesive layer, in the process of bending or folding the display device, the second adhesive layer can apply a pulling force on the display panel to make the neutral surface of the display panel move upward to effectively reduce the number of film layers that are squeezed in the display panel. Thus, the extent of the display panel being squeezed is reduced, the creases caused by bending the display panel are reduced, and the overall display effect of the display device and the user's experience are improved.

In some embodiments, the foldable display device may be a product or component having a display function, such as a mobile phone, a tablet computer, a television set, a monitor, a notebook computer, or a digital camera.

In the embodiments of the present disclosure, the display assembly and the foldable display device at least achieve the following beneficial effects.

The display assembly and the foldable display device provided by the embodiments of the present disclosure include a display panel, a support plate, and an adhesive layer. The support plate is disposed at a surface of the display panel facing away from a light-emitting surface of the display panel, that is, a non-display surface of the display panel. The support plate and the display panel are bonded together through the adhesive layer. The display includes a bending area and non-bending areas disposed at both sides of the bending area. The support plate is disposed at the non-bending areas for supporting the display panel in the non-bending areas to prevent the display panel in the non-bending areas from being deformed. Further, the support plate is attached to the non-display surface of the display panel through the adhesive layer, thereby ensuring the bending performance of the display assembly and at the same time enhancing an overall stiffness of the display assembly through the support plate. The enhanced stiffness substantially reduces the creases caused by being the display assembly. The adhesive layer includes a first adhesive layer disposed at the non-bending areas and a second adhesive layer disposed at the bending area. The first adhesive layer disposed at the non-bending areas is used to bond and fix the support plate and the display panel. The second adhesive layer disposed at the bending area is connected to the first adhesive layer disposed at the non-bending areas. At least a portion of the bending area includes no adhesive layer. In other words, the second adhesive layer does not completely cover the bending area. To a certain extent, the present disclosure can prevent a display area in the bending area from being excessively squeezed by structures to produce defective products. When the display assembly is in a folded state, the second adhesive layer disposed at the bending area applies a pulling force on the display panel to make a neutral surface of the display panel move upward. Compared with the neutral surface being located at a surface of the display panel facing toward the support plate, the number of film layers disposed above the neutral surface (in a direction pointing toward a light-emitting surface of the display panel) are reduced in the display panel when the display assembly is in the folded state. Thus, the number of film layers that are squeezed in the display panel is reduced, the extent of being squeezed is reduced, the creases caused by bending the bending area are reduced, and the overall display effect of display products and user's experience are improved.

In the specification, specific examples are used to explain the principles and implementations of the present disclosure. The description of the embodiments is intended to assist comprehension of the methods and core inventive ideas of the present disclosure. At the same time, those of ordinary skill in the art may change or modify the specific implementation and the scope of the application according to the embodiments of the present disclosure. Thus, the content of the specification should not be construed as limiting the present disclosure.

What is claimed is:

1. A display assembly, comprising:
   a display panel;
   a support plate disposed at a non-display surface of the display panel; and
   an adhesive layer for bonding the display panel and the support plate together,
   wherein:
   the display panel includes at least a bending area and non-bending areas disposed at two sides of the bending area;
   the support plate is disposed at the non-bending areas;
   the adhesive layer includes a first adhesive layer disposed at the non-bending areas and between the display panel and the support plate and a second adhesive layer disposed at the bending area and connected to the first adhesive layer;
   at least a portion of the bending area is not covered by the adhesive layer;
   the display assembly includes an unfolded state and a folded state;
   in the folded state, the bending area has a semicircular shape;
   the display assembly includes a central axis in the bending area; and
   a distance between an end surface of the second adhesive layer facing toward the central axis and the central axis is L0, wherein $L0=(R-h)\cdot\pi\cdot0.5$, $0<h<R$, R is a radius of the semicircle shape formed in a folding area when the display panel is in the folded state, h is a distance between a neutral surface of the display panel and a surface of the support plate facing toward the display panel, and the neutral surface of the display panel is a virtual plane of the display panel that is neither under tension nor under press.

2. The display assembly according to claim 1, wherein:
   the non-bending area includes a first non-bending sub-area and a second non-bending sub-area adjacent to a same bending area
   the bending area includes a first bending sub-area adjacent to the first non-bending sub-area and a second bending sub-area adjacent to the second non-bending sub-area;
   the first bending sub-area and the second bending sub-area are separated by a first gap; and
   the second adhesive layer is disposed at the first bending sub-area and the second bending sub-area.

3. The display assembly according to claim 2, wherein:
   in a direction along the non-bending area pointing toward the bending area, a width of the second adhesive layer disposed at the first bending sub-area is equal to a width of the second adhesive layer disposed at the second bending sub-area.

4. The display assembly according to claim 2, wherein:
   a thickness of the second adhesive layer disposed at the first bending sub-area is equal to a thickness of the second adhesive layer disposed at the second bending sub-area.

5. The display assembly according to claim 1, wherein:
   a thickness of the display panel is H, and h<H.

6. The display assembly according to claim 1, wherein:
   a thickness of the first adhesive layer is equal to a thickness of the second adhesive layer.

7. The display assembly according to claim 1, wherein:
   the first adhesive layer and the second adhesive layer are formed into a single piece.

8. The display assembly according to claim 1, wherein:
   a cover film is disposed in the bending area at a surface of the second adhesive layer facing away from the display panel.

9. The display assembly according to claim 8, wherein:
   the support plate extends into the bending area and is multiplexed as the cover film.

10. The display assembly according to claim 1, wherein:
    the display panel includes a substrate made of polyimide or stainless steel.

11. The display assembly according to claim 1, wherein:
    the display panel includes an organic electroluminescence light-emitting display panel, an electronic paper, or an inorganic light-emitting diode display panel.

12. A foldable display device comprising a display assembly, wherein the display assembly includes:
    a display panel;
    a support plate disposed at a non-display surface of the display panel; and
    an adhesive layer for bonding the display panel and the support plate together,
    wherein:
    the display panel includes at least a bending area and non-bending areas disposed at two sides of the bending area;
    the support plate is disposed at the non-bending areas;
    the adhesive layer includes a first adhesive layer disposed at the non-bending areas and between the display panel and the support plate and a second adhesive layer disposed at the bending area and connected to the first adhesive layer;
    at least a portion of the bending area is not covered by the adhesive layer;
    the display assembly includes an unfolded state and a folded state;
    in the folded state, the bending area has a semicircular shape;
    the display assembly includes a central axis in the bending area; and
    a distance between an end surface of the second adhesive layer facing toward the central axis and the central axis is L0, wherein $L0=(R-h)\cdot\pi\cdot0.5$, $0<h<R$, R is a radius of the semicircle shape formed in a folding area when the display panel is in the folded state, h is a distance between a neutral surface of the display panel and a surface of the support plate facing toward the display panel, and the neutral surface of the display panel is a virtual plane of the display panel that is neither under tension nor under press.

13. The foldable display device according to claim 12, wherein:
   the non-bending area includes a first non-bending sub-area and a second non-bending sub-area adjacent to a same bending area;
   the bending area includes a first bending sub-area adjacent to the first non-bending sub-area and a second bending sub-area adjacent to the second non-bending sub-area;
   the first bending sub-area and the second bending sub-area are separated by a first gap; and
   the second adhesive layer is disposed at the first bending sub-area and the second bending sub-area.

14. The foldable display device according to claim 13, wherein:
   in a direction along the non-bending area pointing toward the bending area, a width of the second adhesive layer disposed at the first bending sub-area is equal to a width of the second adhesive layer disposed at the second bending sub-area.

15. The foldable display device according to claim 13, wherein:
   a thickness of the second adhesive layer disposed at the first bending sub-area is equal to a thickness of the second adhesive layer disposed at the second bending sub-area.

16. The foldable display device according to claim 12, wherein:
   a thickness of the display panel is H, and h<H.

* * * * *